(12) United States Patent
Lee et al.

(10) Patent No.: US 10,770,501 B2
(45) Date of Patent: Sep. 8, 2020

(54) BACK SIDE ILLUMINATED IMAGE SENSOR WITH DEEP TRENCH ISOLATION STRUCTURES AND SELF-ALIGNED COLOR FILTERS

(71) Applicant: Taiwan Semiconductor Manufacturing Company, Ltd., Hsinchu (TW)

(72) Inventors: Kuo-Cheng Lee, Tainan (TW); Yun-Wei Cheng, Taipei (TW); Yung-Lung Hsu, Tainan (TW); Hsin-Chi Chen, Tainan (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 276 days.

(21) Appl. No.: 15/785,595

(22) Filed: Oct. 17, 2017

(65) Prior Publication Data
US 2018/0040661 A1 Feb. 8, 2018

Related U.S. Application Data

(62) Division of application No. 14/261,481, filed on Apr. 25, 2014, now Pat. No. 9,799,697.

(51) Int. Cl.
H01L 27/146 (2006.01)

(52) U.S. Cl.
CPC ...... *H01L 27/1464* (2013.01); *H01L 27/1462* (2013.01); *H01L 27/1463* (2013.01); *H01L 27/14621* (2013.01); *H01L 27/14623* (2013.01); *H01L 27/14629* (2013.01); *H01L 27/14636* (2013.01); *H01L 27/14645* (2013.01); *H01L 27/14698* (2013.01); *H01L 27/14685* (2013.01)

(58) Field of Classification Search
CPC ......... H01L 27/14621; H01L 27/14623; H01L 27/14629; H01L 27/1464
See application file for complete search history.

(56) References Cited

U.S. PATENT DOCUMENTS

| | | | |
|---|---|---|---|
| 8,436,440 B2 * | 5/2013 | Marty | H01L 27/1463 257/432 |
| 8,928,784 B2 | 1/2015 | Watanabe et al. | |
| 9,281,338 B2 | 3/2016 | Chen et al. | |
| 9,553,118 B2 | 1/2017 | Cheng et al. | |
| 9,905,598 B2 * | 2/2018 | Yamazaki | H01L 27/1207 |
| 2010/0327390 A1 | 12/2010 | McCarten et al. | |
| 2012/0320242 A1 * | 12/2012 | Ogita | H01L 27/14621 348/276 |
| 2013/0249040 A1 | 9/2013 | Liu et al. | |
| 2014/0291793 A1 * | 10/2014 | Tanaka | H01L 27/14623 257/435 |
| 2015/0001660 A1 * | 1/2015 | Fukumizu | H01L 31/0232 257/432 |

* cited by examiner

*Primary Examiner* — Marcos D. Pizarro
(74) *Attorney, Agent, or Firm* — Haynes and Boone, LLP

(57) ABSTRACT

A semiconductor image sensor includes a substrate having a first side and a second side that is opposite the first side. An interconnect structure is disposed over the first side of the substrate. A plurality of radiation-sensing regions is located in the substrate. The radiation-sensing regions are configured to sense radiation that enters the substrate from the second side. A plurality of isolation structures are each disposed between two respective radiation-sensing regions. The isolation structures protrude out of the second side of the substrate.

20 Claims, 11 Drawing Sheets

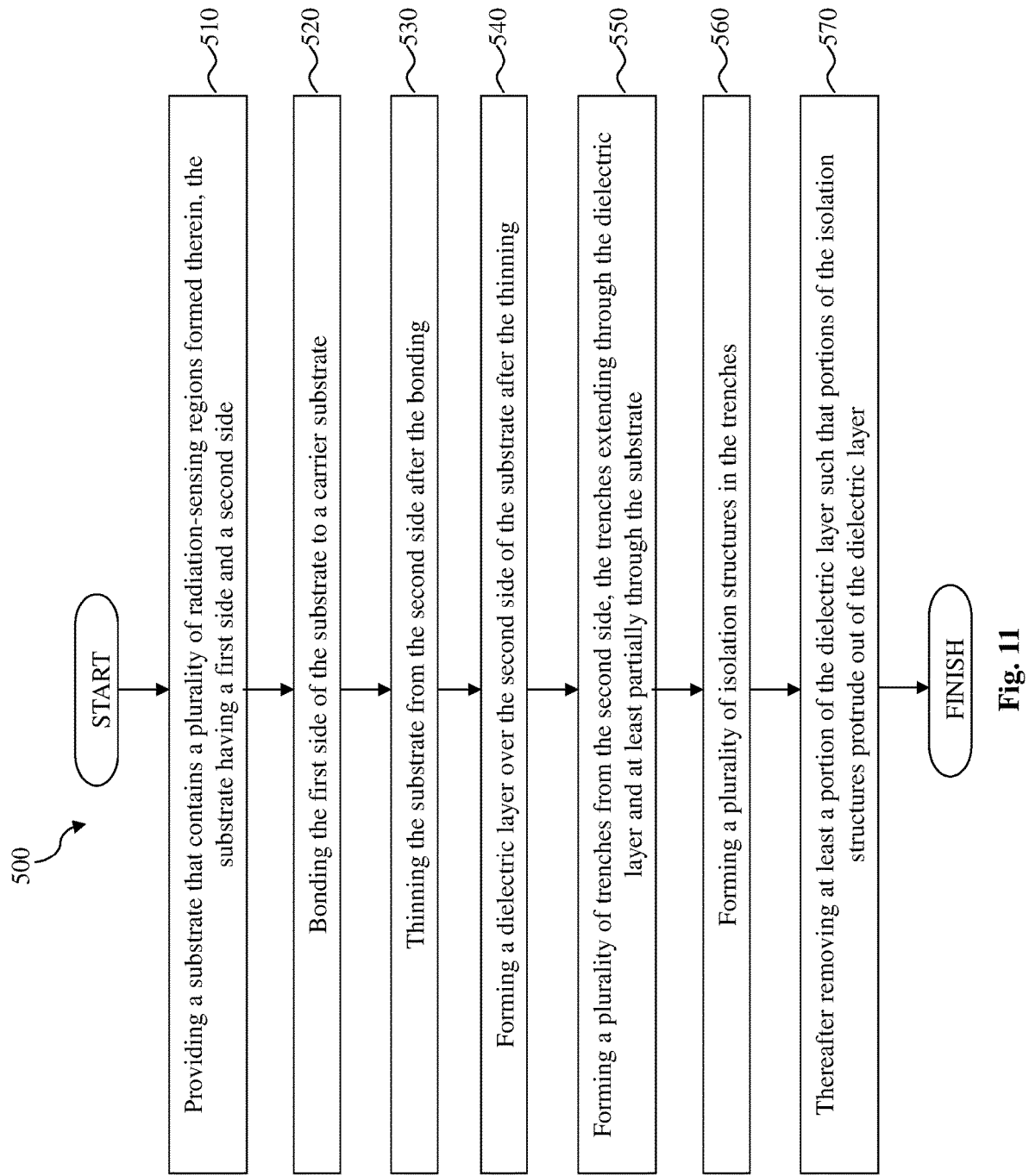

BACK SIDE ILLUMINATED IMAGE SENSOR WITH DEEP TRENCH ISOLATION STRUCTURES AND SELF-ALIGNED COLOR FILTERS

PRIORITY DATA

The present application is a division application of U.S. patent Ser. No. 14/261,481, filed Apr. 25, 2014 now U.S. Pat. No. 9,799,697, the entire disclosure of which is incorporated herein by reference.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels (which may include photodiodes and transistors) in a substrate to absorb (i.e., sense) radiation that is projected toward the substrate and convert the sensed radiation into electrical signals.

A back side illuminated (BSI) image sensor device is one type of image sensor device. These BSI image sensor devices are operable to detect light from the backside. Compared to front side illuminated (FSI) image sensor devices, BSI image sensor devices have improved performance, especially under low light conditions. However, traditional methods of fabricating BSI image sensor devices may still lead to certain shortcomings for BSI image sensor devices. For example, traditional BSI image sensors may require two types of isolation structures—for example a trench isolation as well as a metal grid—to provide sufficient isolation between adjacent pixels so as to reduce cross-talk. However, the need for having two different types of isolation devices result in more complicated (and lengthier) fabrication processes, which may increase fabrication costs. In addition, the two types of isolation structures need to be accurately aligned, and any misalignment may lead to substandard device performance and may even result in device failures.

Hence, while existing BSI image sensor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is a flowchart illustrating a method of fabricating an image sensor device in accordance with some embodiments.

DETAILED DESCRIPTION

Figure 1:
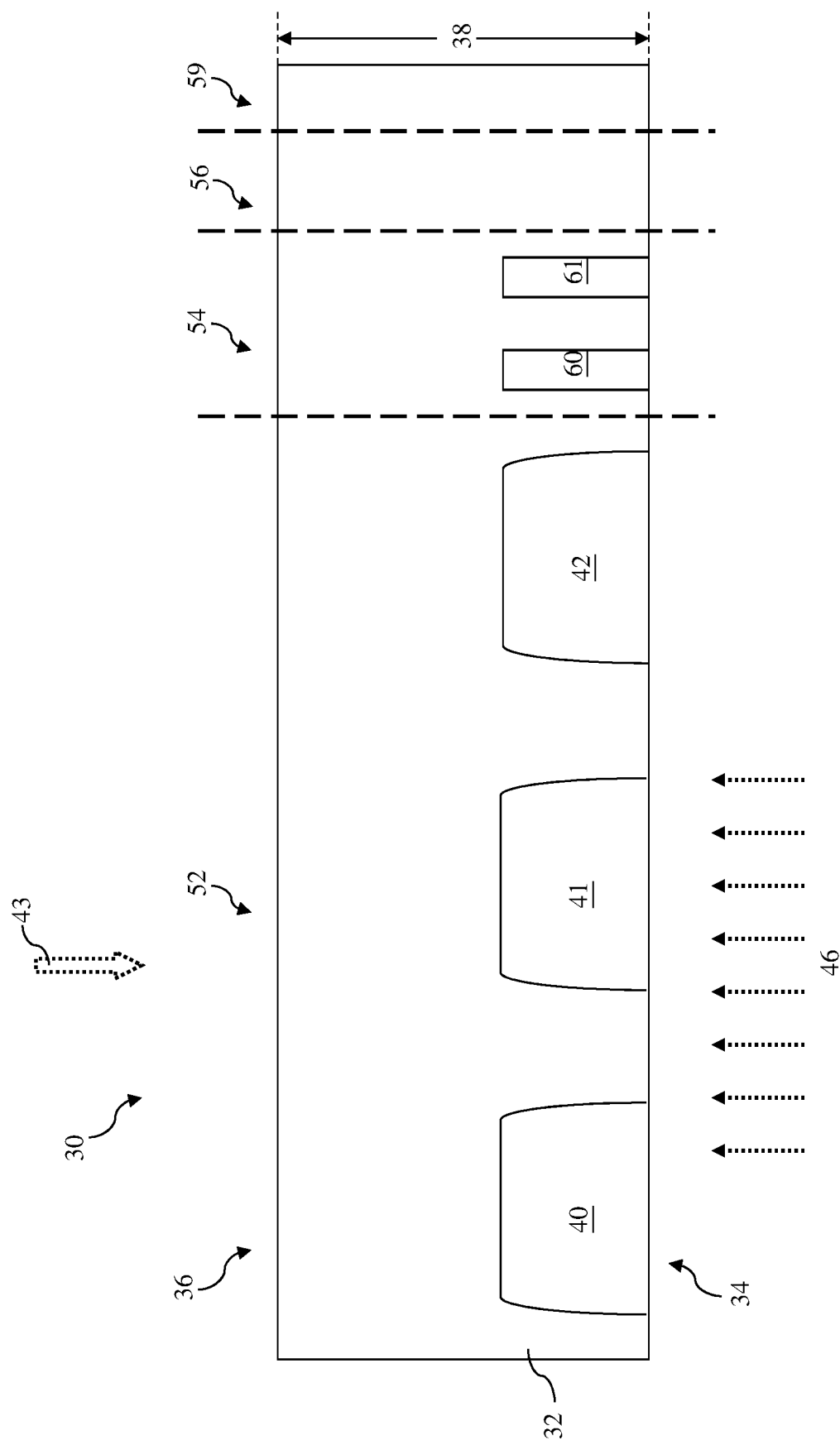
FIGS. 1-10 are simplified fragmentary cross-sectional side views of a portion of an image sensor device at various stages of fabrication in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1-10 are simplified diagrammatic fragmentary sectional side views a BSI image sensor device 30 at various stages of fabrication according to aspects of the present disclosure. The image sensor device 30 includes an array or grid of pixels for sensing and recording an intensity of radiation (such as light) directed toward a back-side of the image sensor device 30. The image sensor device 30 may include a charge-coupled device (CCD), complementary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 6 have been simplified for a better understanding of the inventive concepts of the present disclosure and may not be drawn to scale.

With reference to FIG. 1, the image sensor device 30 includes a device substrate 32. In the illustrated embodiment, the device substrate 32 contains a silicon material doped with a p-type dopant such as boron (for example a p-type substrate). Alternatively, the device substrate 32 could contain another suitable semiconductor material. For example, the device substrate 32 may include silicon that is doped with an n-type dopant such as phosphorous or arsenic (an n-type substrate). The device substrate 32 could also contain other elementary semiconductors such as germanium and diamond. The device substrate 32 could optionally include a compound semiconductor and/or an alloy semiconductor. Further, the device substrate 32 could include an epitaxial layer (epi layer), may be strained for performance enhancement, and may include a silicon-on-insulator (SOI) structure.

The device substrate 32 has a front side (also referred to as a front surface) 34 and a back side (also referred to as a back surface) 36. The device substrate 32 also has an initial thickness 38 that is in a range from about 100 microns (um) to about 3000 um. In the present embodiment, the initial thickness 38 is in a range from about 500 um to about 1000 um.

Radiation-sensing regions—for example, pixels 40, 41, and 42—are formed in the device substrate 32. The pixels 40-42 are configured to sense radiation (or radiation waves), such as an incident light 43, that is projected toward device substrate 32 from the back side 36. The light 43 would enter the device substrate 32 through the back side 36 (or the back surface) and be detected by one or more of the pixels 40-42. The pixels 40-42 each include a photodiode in the present embodiment. In other embodiments, the pixels 40-42 may include pinned layer photodiodes, photogates, reset transistors, source follower transistors, and transfer transistors. The pixels 40-42 may also be referred to as radiation-detection devices or light-sensors.

The pixels 40-42 may be varied from one another to have different junction depths, thicknesses, widths, and so forth. For the sake of simplicity, only three pixels 40-42 are illustrated in FIG. 1, but it is understood that any number of pixels may be implemented in the device substrate 32. In the embodiment shown, the pixels 40-42 are formed by performing an implantation process 46 on the device substrate 32 from the front side 34. The implantation process 46 includes doping the device substrate 32 with a p-type dopant such as boron. In an alternative embodiment, the implantation process 46 may include doping the device substrate 32 with an n-type dopant such as phosphorous or arsenic. In other embodiments, the pixels 40-42 may also be formed by a diffusion process.

Still referring to FIG. 1, the pixels 40-42 are formed in a region of the image sensor device 30 referred to as a pixel region 52 (or a pixel-array region). In addition to the pixel region 52, the image sensor 30 may also include a periphery region 54, a bonding pad region 56, and a scribe line region 59. The dashed lines in FIG. 1 designate the approximate boundaries between the regions 52, 54, 56, and 59, though it is understood that these regions 52, 54, 56 and 59 are not drawn in scale herein.

The periphery region 54 includes devices 60 and 61 that need to be kept optically dark. For example, the device 60 in the present embodiment may be a digital device, such as an application-specific integrated circuit (ASIC) device or a system-on-chip (SOC) device. The device 61 may be a reference pixel that is used to establish a baseline of an intensity of light for the image sensor device 30.

The bonding pad region 56 includes a region where one or more bonding pads (not illustrated herein) of the image sensor device 30 will be formed in a later processing stage, so that electrical connections between the image sensor device 30 and external devices may be established. The scribe line region 59 includes a region that separates one semiconductor die (for example, a semiconductor die that includes the bonding pad region 56, the periphery region 54, and the pixel region 52) from an adjacent semiconductor die (not illustrated). The scribe line region 59 is cut therethrough in a later fabrication process to separate adjacent dies before the dies are packaged and sold as integrated circuit chips. The scribe line region 59 is cut in such a way that the semiconductor devices in each die are not damaged. It is also understood that these regions 52-59 may extend vertically above and below the device substrate 32.

Figure 2:
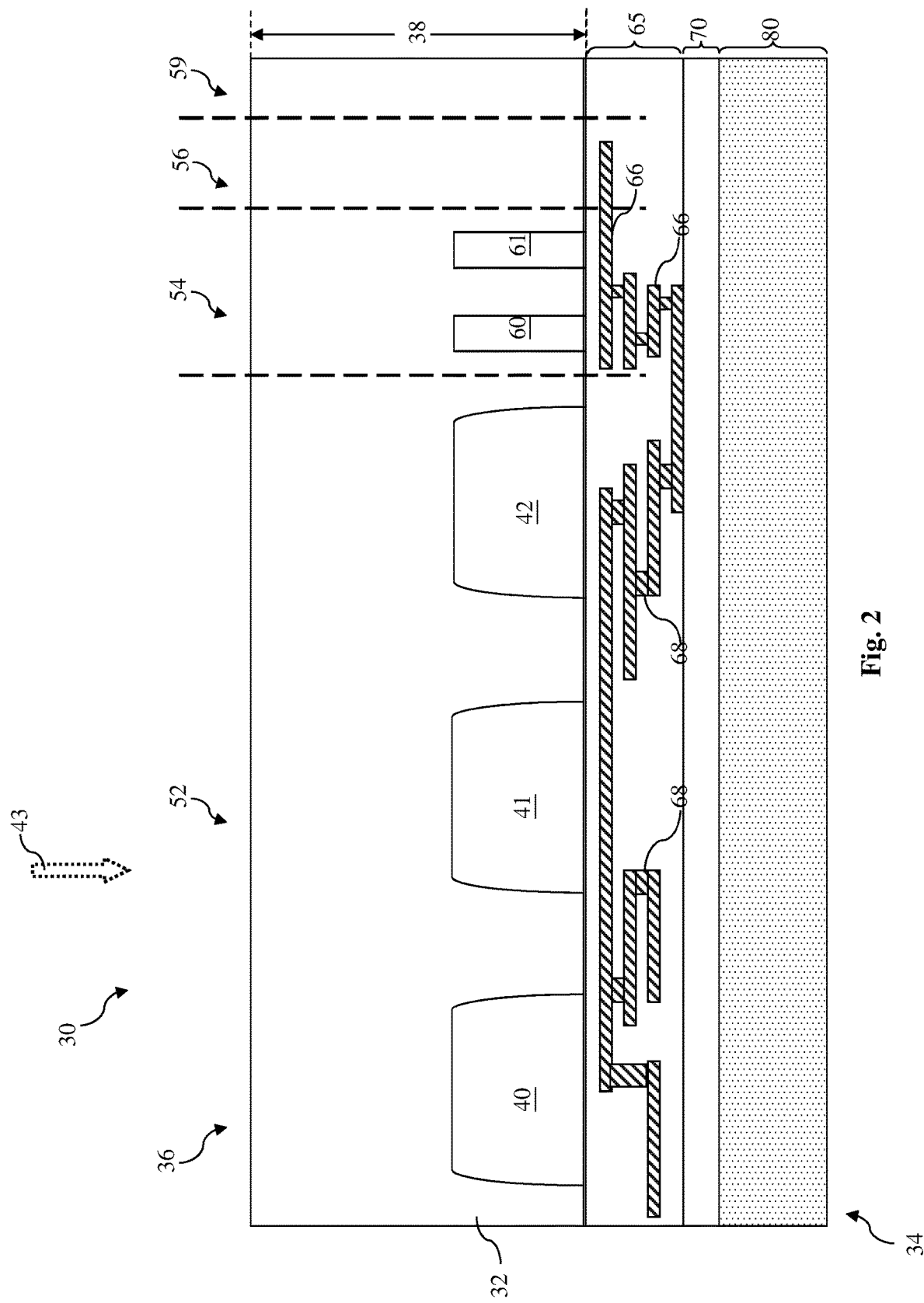

Referring now to FIG. 2, an interconnect structure 65 is formed over the front side 34 of the device substrate 32. The interconnect structure 65 includes a plurality of patterned dielectric layers and conductive layers that provide interconnections (e.g., wiring) between the various doped features, circuitry, and input/output of the image sensor device 30. The interconnect structure 65 includes an interlayer dielectric (ILD) and a multilayer interconnect (MLI) structure. The MLI structure includes contacts, vias and metal lines. For purposes of illustration, a plurality of conductive lines 66 and vias/contacts 68 are shown in FIG. 2, it being understood that the conductive lines 66 and vias/contacts 68 illustrated are merely exemplary, and the actual positioning and configuration of the conductive lines 66 and vias/contacts 68 may vary depending on design needs.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 68) and horizontal connection (for example, conductive lines 66). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 2, a buffer layer 70 is formed over the front side 34 of the interconnect structure 80. In the present embodiment, the buffer layer 70 includes a dielectric material such as silicon oxide. Alternatively, the buffer layer 70 may optionally include silicon nitride. The buffer layer 70 may be formed by CVD, PVD, or other suitable techniques. The buffer layer 70 is planarized to form a smooth surface by a CMP process.

Thereafter, a carrier substrate 80 is bonded with the device substrate 40 through the buffer layer 100 and the interconnect structure 65, so that processing of the back side 36 of the device substrate 32 can be performed. The carrier substrate 80 in the present embodiment is similar to the device substrate 32 and includes a silicon material. Alternatively, the carrier substrate 80 may include a glass substrate or another suitable material. The carrier substrate 80 may be bonded to the device substrate 32 by molecular forces—a technique known as direct bonding or optical fusion bonding—or by other bonding techniques known in the art, such as metal diffusion or anodic bonding.

Among other things, the buffer layer 70 provides electrical isolation between the device substrate 32 and the carrier substrate 80. The carrier substrate 80 provides protection for the various features formed on the front side 34 of the device substrate 32, such as the pixels 40-42 formed therein. The carrier substrate 80 also provides mechanical strength and support for processing of the back side 36 of the device substrate 32 as discussed below. After bonding, the device substrate 32 and the carrier substrate 80 may optionally be annealed to enhance bonding strength.

Figure 3:
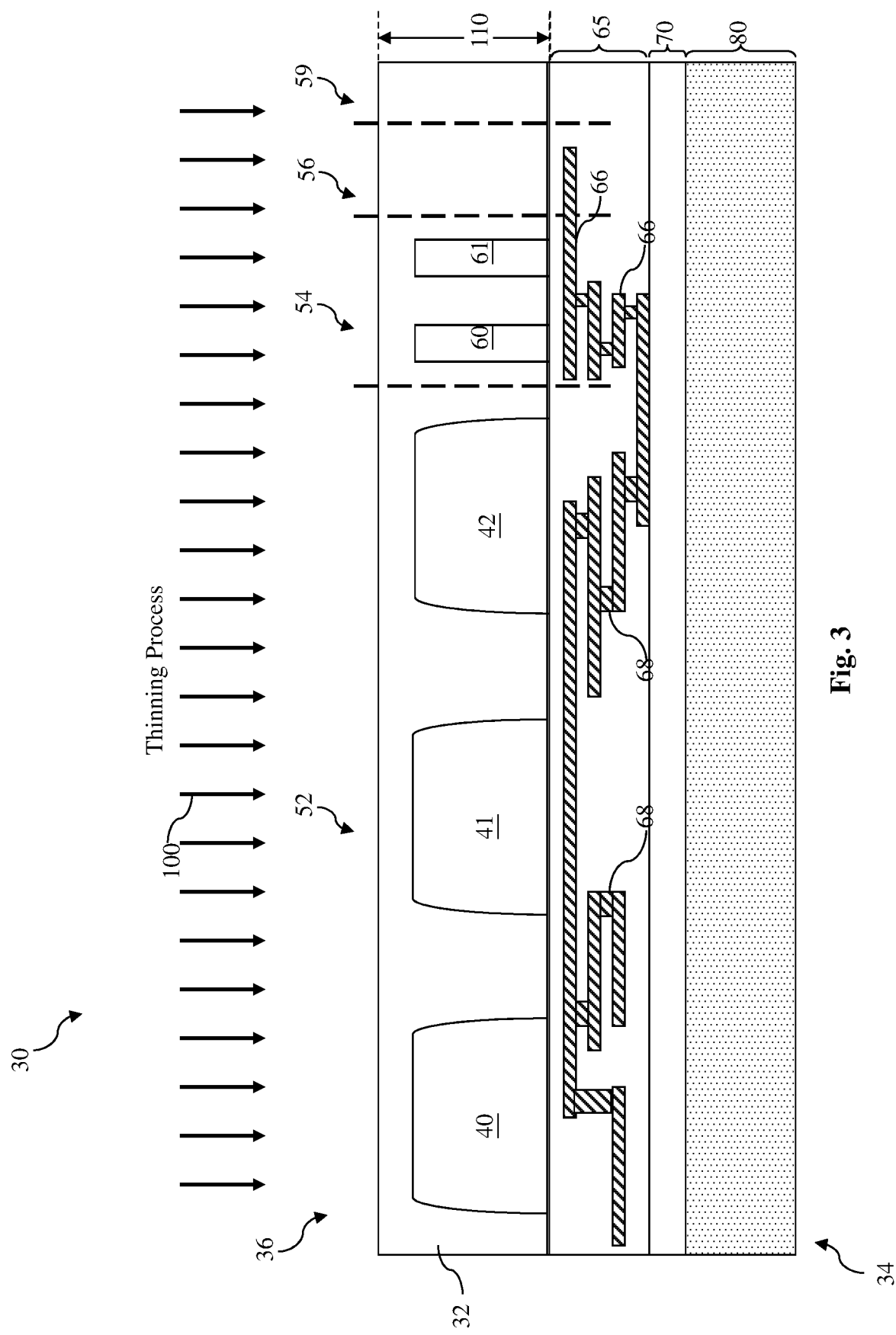

Referring now to FIG. 3, after the carrier substrate 80 is bonded to the device substrate 32, a thinning process 100 is then performed to thin the device substrate 32 from the backside 36. The thinning process 100 may include a mechanical grinding process and a chemical thinning process. A substantial amount of substrate material may be first removed from the device substrate 32 during the mechanical grinding process. Afterwards, the chemical thinning process may apply an etching chemical to the back side 36 of the device substrate 32 to further thin the device substrate 32 to a thickness 110, which is on the order of a few microns. In some embodiments, the thickness 110 is greater than about 1 um but less than about 3 um. It is also understood that the particular thicknesses disclosed in the present disclosure are mere examples and that other thicknesses may be implemented depending on the type of application and design requirements of the image sensor device 30.

According to the various aspects of the present disclosure, deep trench isolation structures will be formed in the image sensor device 30 from the back side 36. The deep trench isolation structures of the present disclosure effectively replace the trench isolation and the metal grid of conventional image sensor devices. The various fabrication steps for forming the deep trench isolation structures are discussed below in more detail with reference to FIGS. 4-10. For reasons of simplicity, FIGS. 4-10 illustrate the pixel region 52 but do not illustrate the periphery region 54, the bonding pad region 56, and the scribe line region 59.

Figure 4:
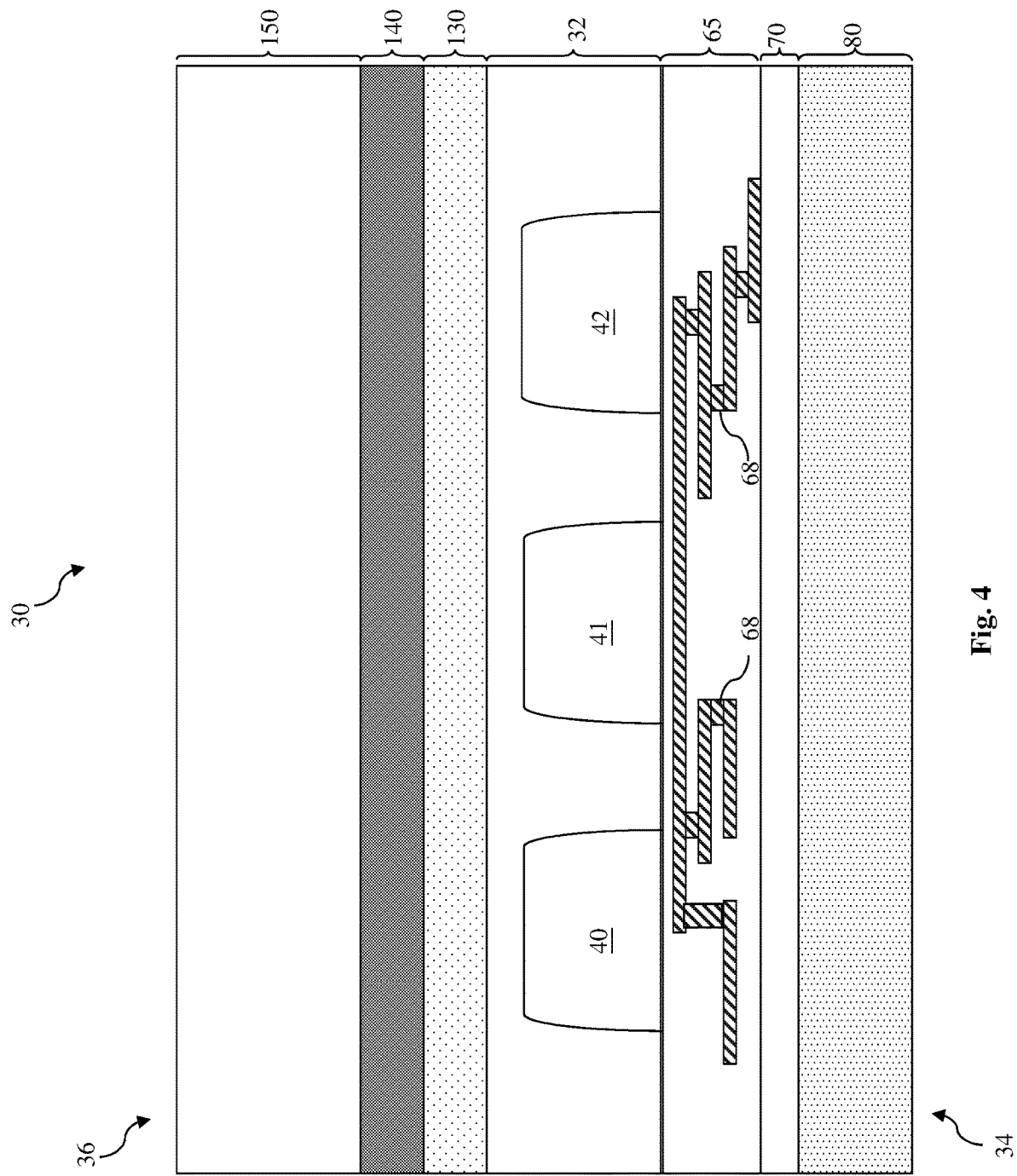

Referring now to FIG. 4, an anti-reflective coating (ARC) layer 130 is formed over the back side 36 of the device substrate 32. In some embodiments, the ARC layer 130 contains SiCN, SiN, HfO, Al2O3, Ta2O5, ZrO. The ARC layer 130 may have a thickness in a range from about 20 angstroms to about 100 angstroms. A buffer layer 140 is then formed over the ARC layer 130. In some embodiments, the buffer layer 140 contains SiCN, SiN, HfO, Al2O3, TaO, ZrO. The buffer layer 140 may have a thickness in a range from about 200 angstroms to about 1000 angstroms. A dielectric layer 150 is then formed over the buffer layer 140. In some embodiments, the dielectric layer 150 contains silicon oxide. The dielectric layer 150 may have a thickness in a range from about 300 angstroms to about 2000 angstroms.

Figure 5:
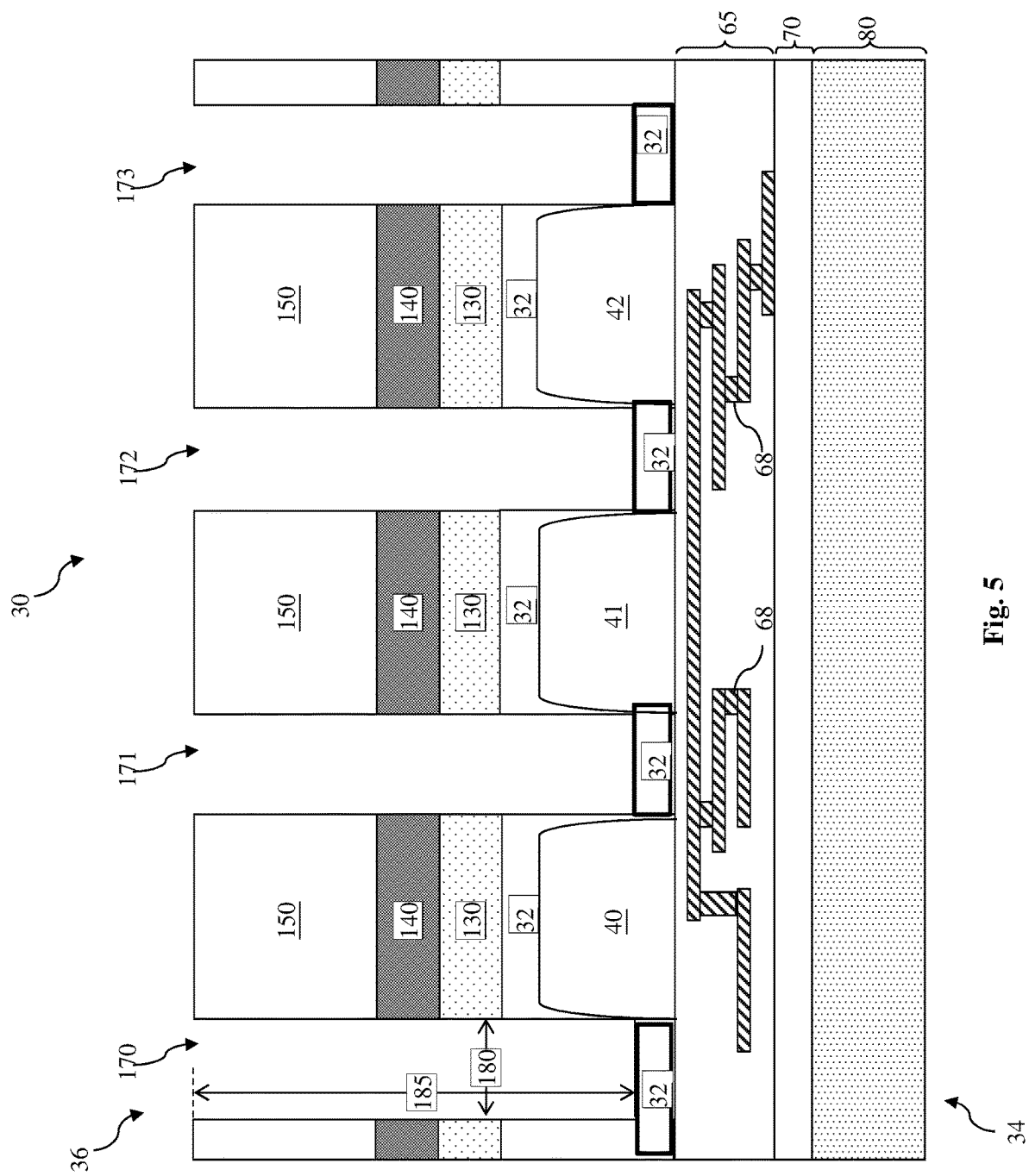

Referring now to FIG. 5, a plurality of trenches is formed from the back side 36, for example trenches 170-173. The trenches 170-173 are formed by one or more etching processes in the illustrated embodiment, but may also be formed using any other suitable methods in other embodiments. The trenches 170-173 are formed to vertically extend completely through the dielectric layer 150, the buffer layer 140, and the ARC layer 130. The trenches 170-173 also extend into the device substrate 32. In the illustrated embodiment, the trenches 170-173 do not vertically extend completely through the device substrate 32, meaning a respective portion of the device substrate 32 is exposed by each of the trenches 170-173. However, in some alternative embodiments, the trenches 170-173 may vertically extend through the device substrate 32 completely.

The trenches 170-173 are reserved for the formation of light-reflective isolation structures (discussed below in more detail) that are configured to block light, such that light intended for one pixel do not enter a wrong pixel (e.g., an adjacent pixel). As such, the trenches 170-173 are formed in between the pixels 40-42. The trenches 170-173 each have a width 180 (i.e., horizontal dimension) and a depth 185 (i.e., vertical dimension). In some embodiments, the width 180 is in a range from about 0.1 micron to about 0.25 microns, and the depth 185 is in a range from about 0.5 microns to about 2 microns. These dimensions 180 and 185 are selected so that the overall size of the image sensor device 30 remains sufficiently small, while still allowing light-reflective isolation structures filling the trenches 170-173 to effectively block light.

Figure 6:
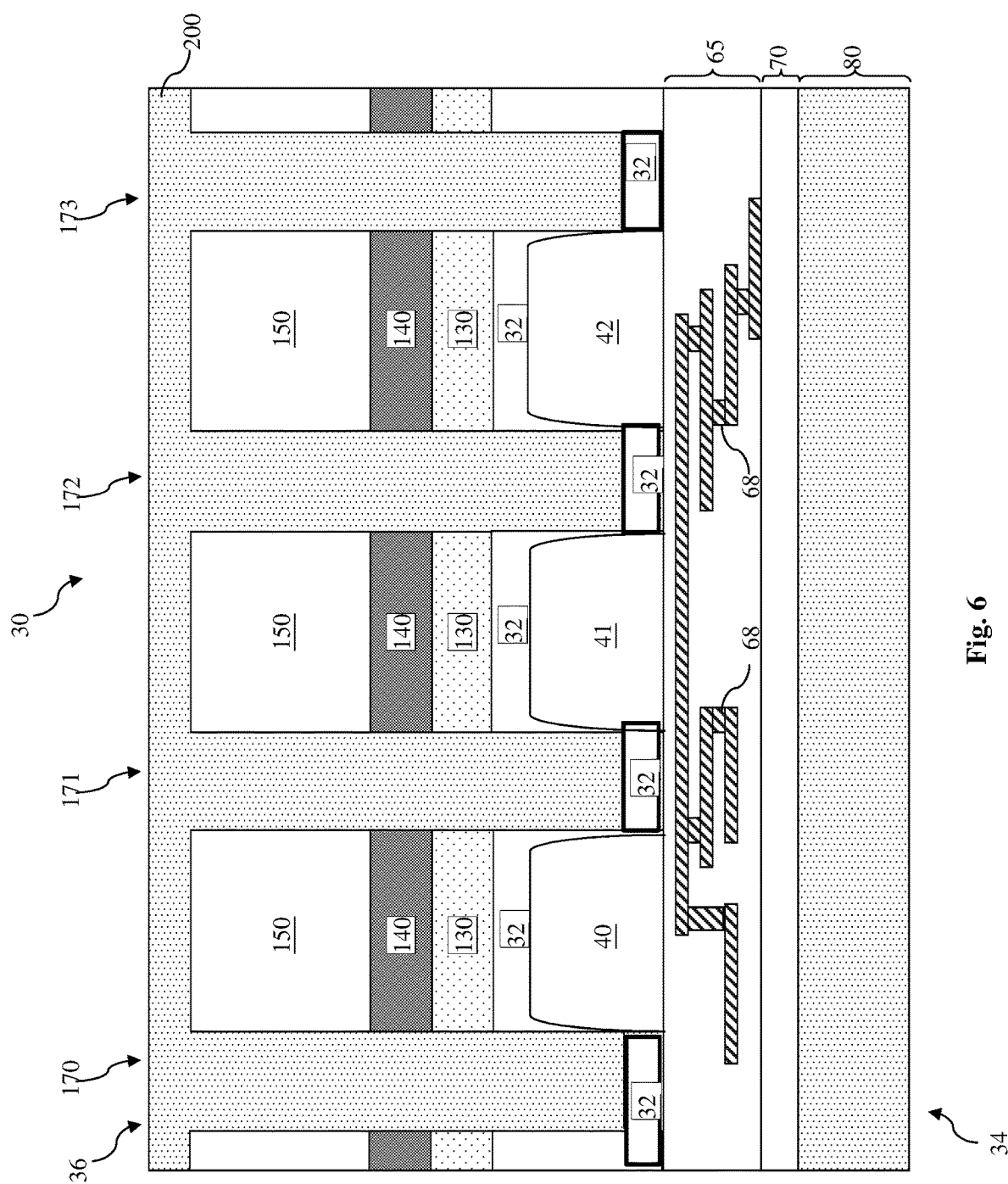

Referring now to FIG. 6, a light-reflective (or radiation-reflective) material 200 is formed over the back side 36 of the image sensor device 30. The light-reflective material 200 may be formed by a suitable deposition process known in the art and completely fills each of the trenches 170-173. In some embodiments, the light-reflective material 200 contains tungsten, which has good gap-filling properties as well as good light reflectivity. In other embodiments, the light-reflective material 200 may contain another suitable metal or non-metal material that can reflect light.

It is also understood that, to reduce undesirable metal diffusion, a barrier layer may be coated on the surfaces of the trenches 170-173 before the light-reflective material 200 is formed in the trenches 170-173. The presence of such barrier layer prevents the light-reflective material 200 from coming into direct physical contact with the device substrate 32 or the layers 130/140/150. In other words, the barrier layer would be sandwiched between the light-reflective material 200 and the various layers defining the trenches 170-173. In some embodiments, the barrier layer may include a dielectric layer such as silicon oxide and/or a high-k material. For reasons of simplicity, the barrier layer is not specifically illustrated herein.

Figure 7:
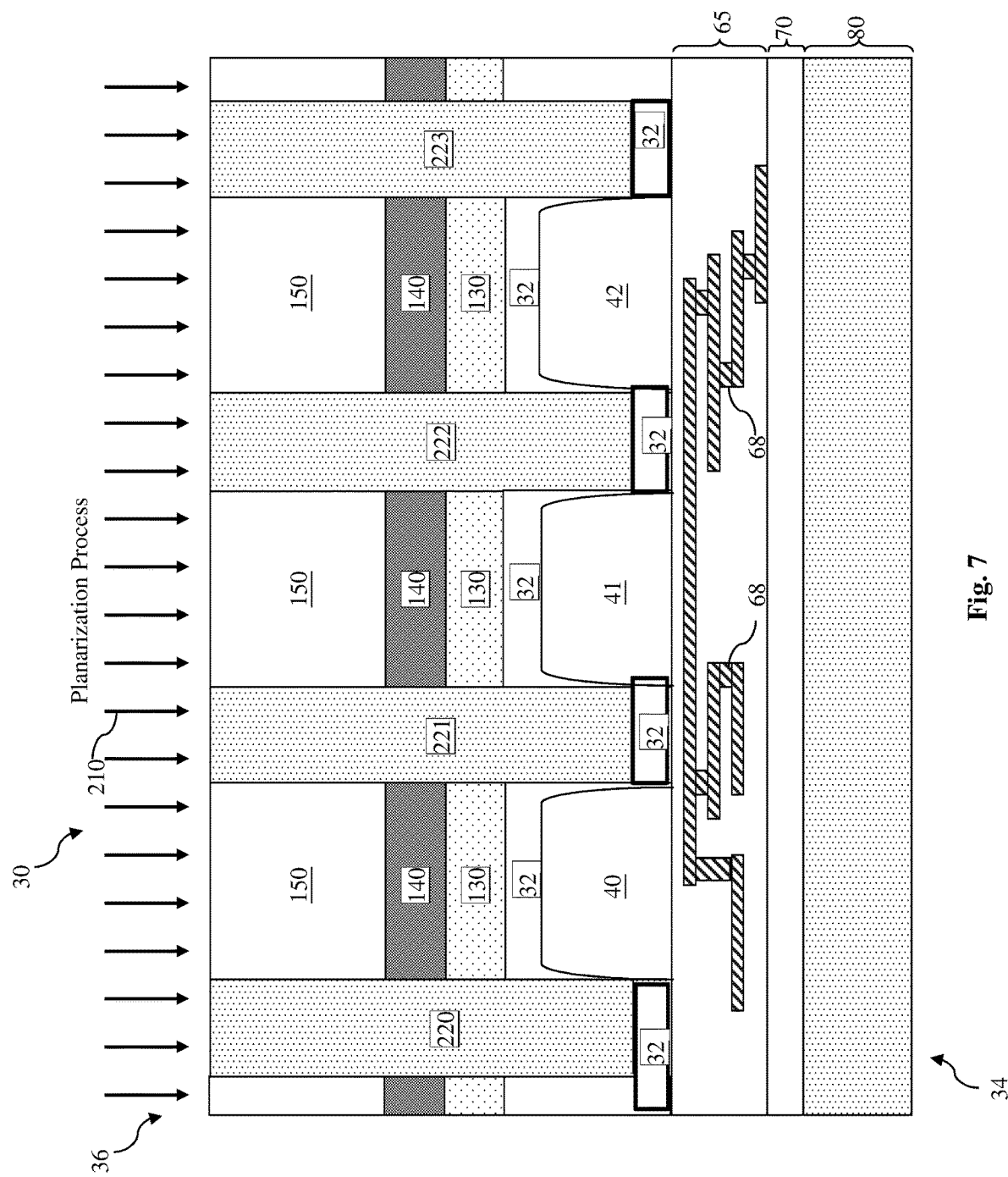

Referring now to FIG. 7, a planarization process 210 is performed to the back side 36 of the image sensor device 30 to remove excess portions of the light-reflective material 200 that are disposed outside the trenches 170-173. The planarization process 210 may include a chemical-mechanical-polishing (CMP) process, for example. After the planarization process 210 is performed, the back side 36 of the image sensor device 30 has a substantially flat or planar surface. At this point, isolation structures 220-223 are formed by the remaining portions of the light-reflective material 200 in the trenches 170-173, respectively. The isolations structures 220-223 serve to prevent and/or reduce cross-talk for the image sensor device 30.

In more detail, it is desirable to reduce "cross-talk" for image sensor devices such as the image sensor device 30. Cross-talk may arise when light targeted for one pixel (e.g., pixel 41) spreads to one or more neighboring pixels (e.g., pixels 40 or 42). Cross-talk will negatively affect image sensor performance, such as degradation of spatial resolution, reduction of overall optical sensitivity, and poor color separation. Therefore, light-reflective isolation structures may need to be implemented between neighboring pixels to prevent or reduce cross-talk. However, traditional image sensor devices rely on two separate isolation structures to prevent cross-talk. One of such isolation structures may be a trench isolation formed in the device substrate, and another one of such isolation structures may be a metal grid formed over the back side of the substrate and underneath the color filter. This approach leads to increased costs associated with more complicated fabrication processes (since two types of isolation structures are needed) and lengthier fabrication time. The conventional approach also requires accurate alignment since any misalignment between the two types of isolation structures may degrade image sensor performance.

In comparison, the present disclosure replaces the two types of isolation structures discussed above in association with conventional image sensor devices with the light-reflective isolation structures 220-223. The isolation structures 220-223 offer better performance in terms of reducing cross-talk between neighboring pixels. For example, in comparison, there is typically a gap disposed between the trench isolation and the metal grid in conventional image sensors, where light can escape to a neighboring pixel through that gap. Here, each isolation structure 220-223 is a continuous structure and contains no gap, thus providing no path for the light to escape. In addition, since the isolation structures 220-223 are each continuous, no alignment or overlay processes are necessary (i.e., the top portion of each of the isolation structures 220-223 is by definition "aligned" with the bottom portion of the isolation structure). Consequently, the image sensor device 30 has improved color shading uniformity (CSU) performance. Furthermore, it is easier and less time-consuming to form the isolation structures 220-223 than to form separate trench isolation and metal grids. Thus, the isolation structures 220-223 also lead to cost savings.

Figure 8:
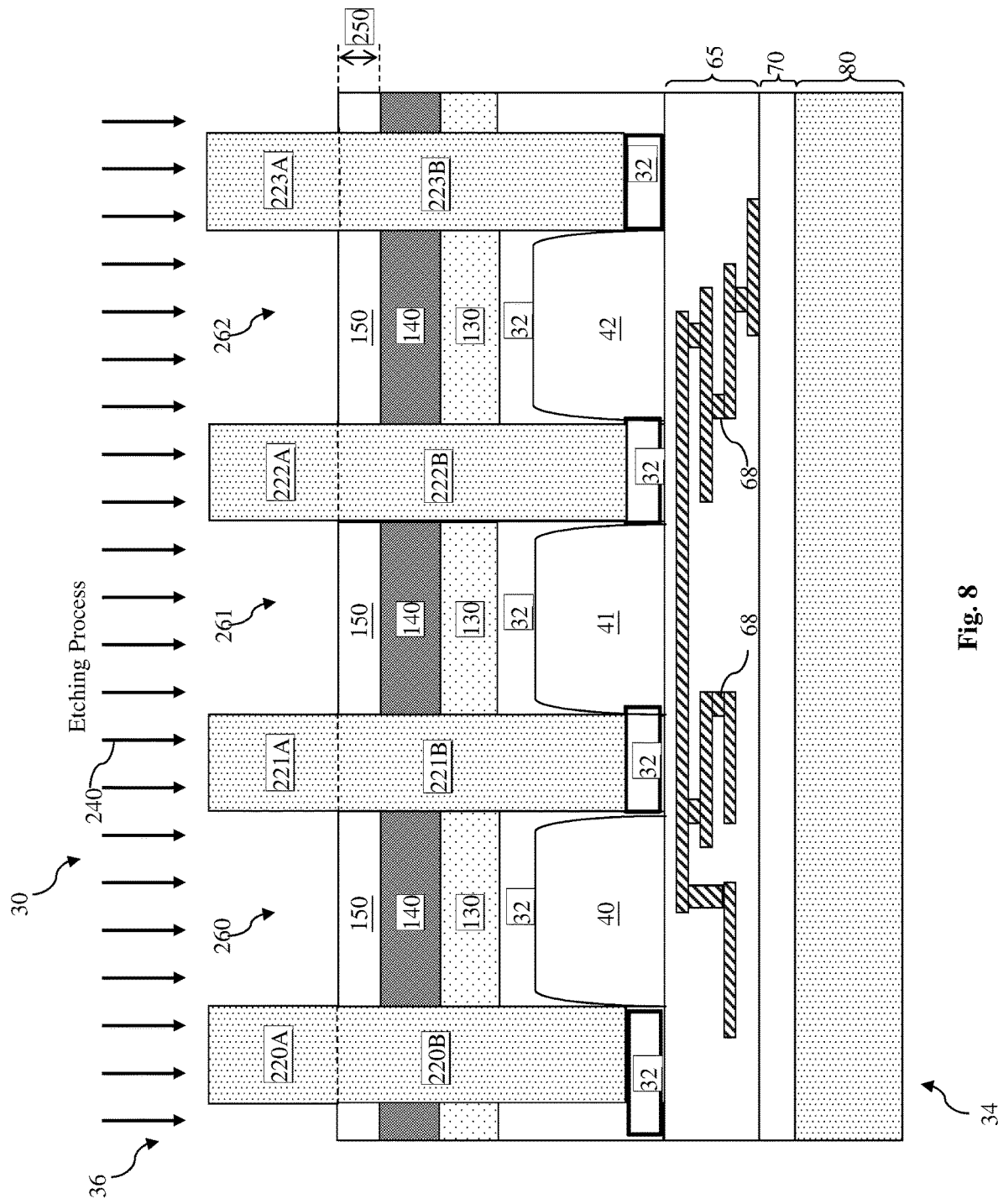

Additional fabrication processes are performed to complete the fabrication of the image sensor device 30. Referring now to FIG. 8, an etching process 240 is performed to remove portions of the dielectric layer 150. The etching 240 process is configured such that a sufficiently large etching selectivity exists between the dielectric layer 150 and the isolation structures 220-223. In other words, the etching rates for the dielectric layer 150 and for the isolation structures 220-223 are sufficiently different such that the dielectric layer 150 may be etched away while the isolation structures 220-223 remains substantially unetched.

In some embodiments, the etching process 240 may use hydrofluoric acid as an etchant. The remaining portion of the dielectric layer 150 has a thickness 250. In some embodiments, the thickness 250 is optimized as a function of the thicknesses of the buffer layer 140 and the ARC layer 130. If the thickness 250 is not optimized, meaning that it is formed to be too thick or too thin, that will negatively impact the optical performance of the image sensor device 30 and may induce a greater amount of crosstalk. Here, the thickness 250 is optimized such that crosstalk is minimized and the optical performance of the image sensor device 30 is enhanced. In some embodiments, the thickness 250 is in a range from about 600 angstroms to about 4000 angstroms.

Due to the partial removal of the dielectric layer 150, it can be seen that portions of the isolation structures 220-223 now protrude out of the dielectric layer 150 toward the back side 36. Alternatively stated, the isolation structures 220-223 may each be conceptually divided into two segments: segments 220A-223A that protrude above the dielectric layer 150 as well as segments 220B-223B that remain buried in the trenches 170-173 (i.e., portions that do not protrude outside of the dielectric layer 150). The boundaries between the segments 220A-223A and 220B-223B are illustrated with broken lines in FIG. 8. Again, it is understood that the division of the isolation structures 220-223 into the segments 220A-223A and 220B-223B is merely conceptual, and there are no actual physical boundaries between the segments 220A-223A and 220B-223B.

At this stage of fabrication, the segments 220A-223A and the remaining portions of the dielectric layer 150 form "U-shaped" structures and as such collectively define a plurality of openings or recesses, for example openings 260-262 as illustrated in FIG. 8.

Figure 9:
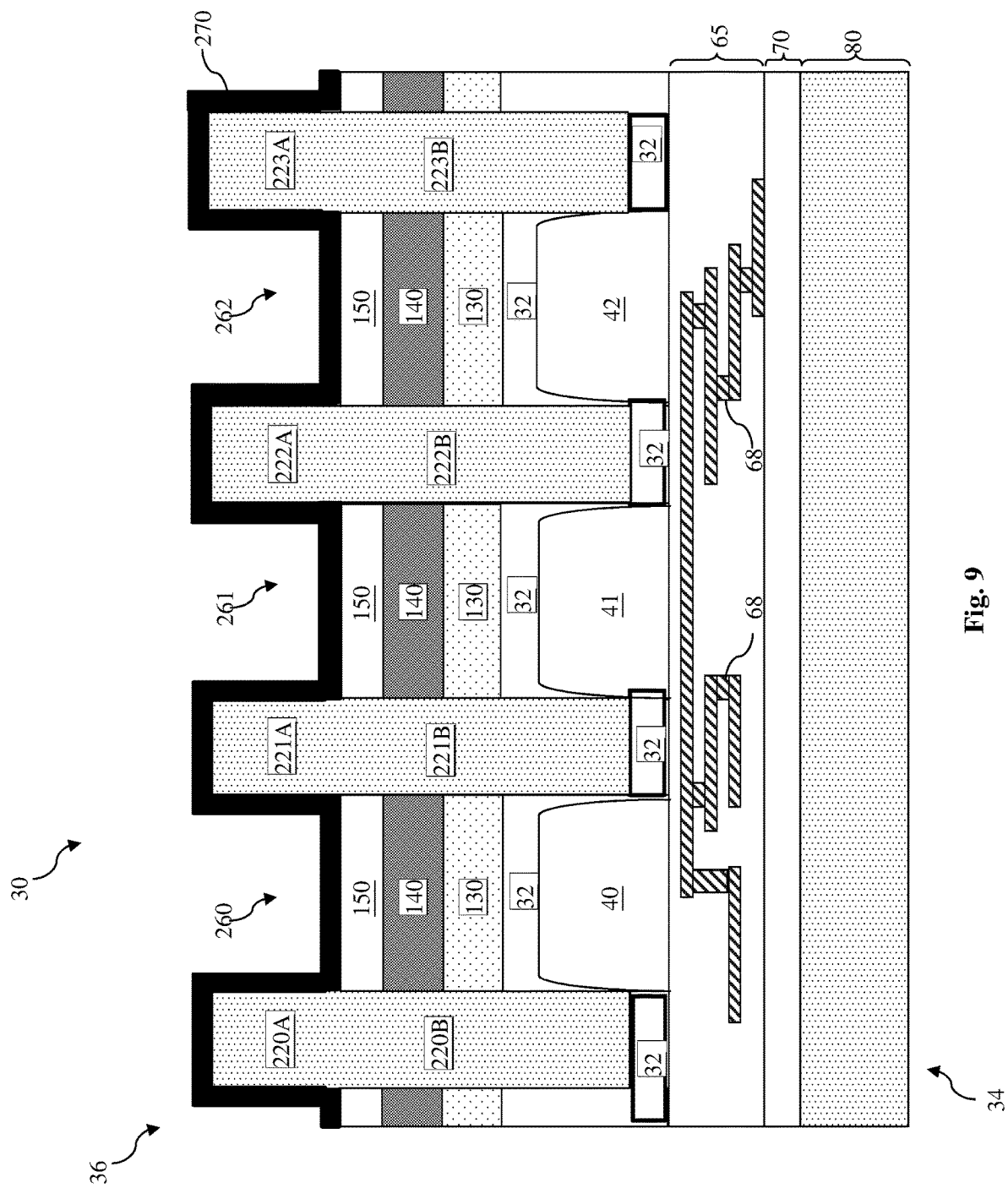

Referring now to FIG. 9, a passivation layer 270 is formed in each of the openings 260-262. In other words, the passivation layer 270 is coated around the segments 220A-223A and over the exposed surfaces of the portions of the dielectric layer 150. The passivation layer 270 may be formed by a suitable deposition process known in the art. In some embodiments, the passivation layer 270 is formed conformally over the segments 220A-223A and over the exposed surfaces of the portions of the dielectric layer 150. The passivation layer 270 may contain a dielectric material. The passivation layer 270 prevents the material (e.g., tungsten) of the segments 220A-223A of the isolation structures from coming into direct physical contact with color filters to be formed in the openings 260-262.

Figure 10:
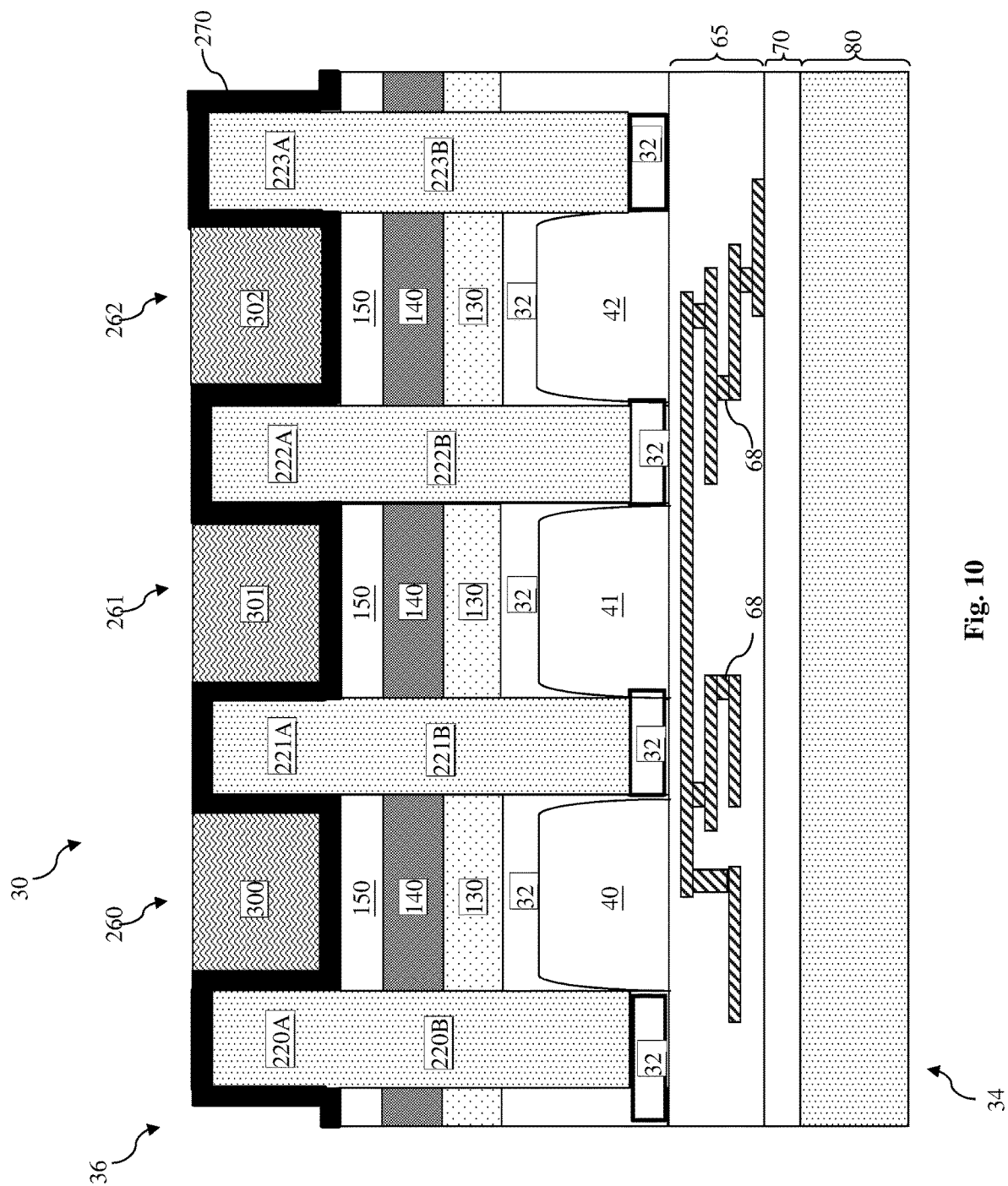

Referring now to FIG. 10, a plurality of color filters 300-301 is formed in the openings 260-262, respectively. In some embodiments, the color filters 300-301 may contain an organic material and may be formed by one or more coating and lithography processes. The color filters 300-301 may also be associated with different colors. For example, the color filter 300 may allow a red light to pass through but will filter out all the other colors of light, the color filter 301 may allow a green light to pass through but will filter out all the other colors of light, and the color filter 302 may allow a blue light to pass through but will filter out all the other colors of light.

The color filters 300-302 may be referred to as buried color filters (or a buried color filter array), since they are buried or embedded in the openings 260-262 defined by the protruding segments 220A-223A of the isolation structures, rather than being formed over or above the isolation structures 220-223. In this manner, the color filters 300-302 are also vertically aligned with the pixels 40-42, respectively. In other words, the alignment between the color filters 300-302 and the pixels 40-42 is attributed at least in part to the fact that the isolation structures 220-223 are disposed between neighboring pixels. As such, it may also be said that the color filters 300-302 are "self-aligned" with the pixels 40-42. Again, the self-aligned color filters 300-302 of the present disclosure improve the cross-talk performance of the image sensor device 30. Furthermore, the fact that the color filters 300-302 are now "buried" between the isolation structures 220-223 also results in shorter optical paths between the color filters 300-302 and the pixels 40-42, which improves the reception of the light in the pixels 40-42.

It is understood that additional processes may be performed to complete the fabrication of the image sensor device 30. For example, micro-lenses may be formed over the color filters, and a plurality of testing, dicing, and packaging processes may also be performed. For reasons of simplicity, these additional processes are not specifically illustrated or discussed in detail herein.

FIG. 11 is a simplified flowchart illustrating a method 500 of fabricating an image sensor device according to embodiments of the present disclosure. The method 500 includes a step 510 of providing a substrate that contains a plurality of radiation-sensing regions formed therein. The substrate has a first side and a second side. An interconnect structure may be formed over the first side of the substrate.

The method 500 includes a step 520 of bonding the first side of the substrate to a carrier substrate. The step 520 is performed such that the interconnect structure is bonded between the substrate and the carrier substrate.

The method 500 includes a step 530 of thinning the substrate from the second side after the bonding. In some embodiments, the thinning step 530 includes one or more chemical and/or mechanical grinding and polishing processes.

The method 500 includes a step 540 of forming a dielectric layer over the second side of the substrate after the thinning. In some embodiments, the dielectric layer includes silicon oxide.

The method 500 includes a step 550 of forming a plurality of trenches from the second side. The trenches extending through the dielectric layer and at least partially through the substrate. The trenches may be formed by one or more etching processes.

The method 500 includes a step 560 of forming a plurality of isolation structures in the trenches. In some embodiments, the isolation structures contain a light-reflective material, such as tungsten. In some embodiments, the light-reflective material may be deposited into the trenches and then polished until portions of the material filling the trenches are co-planar with the dielectric layer.

The method 500 includes a step 570 of removing at least a portion of the dielectric layer such that portions of the isolation structures protrude out of the dielectric layer. In some embodiments, the step 570 may include one or more etching processes, for example an etching process using hydrofluoric acid as an etchant.

It is understood that additional process steps may be performed before, during, or after the steps 510-570 discussed above to complete the fabrication of the semiconductor device. For example, after the step 570 is performed, the portions of the isolation structures protruding out of the dielectric and a remaining portion of the dielectric layer collectively define a plurality of openings. Thereafter, a plurality of color filters may be formed in the plurality of openings, respectively. As another example, a passivation layer may be coated around the portions of the isolation structures that protrude out of the dielectric layer. Other process steps are not discussed herein for reasons of simplicity.

The embodiments of the present disclosure discussed above offer advantages over existing art, though it is understood that different embodiments may offer other advantages, not all advantages are necessarily discussed herein, and that no particular advantage is required for all embodiments. In more detail, the present disclosure replaces the two different types of isolation structures (e.g., trench isolation and metal grids) that are commonly used in conventional image sensors with a single type of isolation structure. The isolation structures extend from the back side of the image sensor into the substrate and effectively provide barriers for radiation such as visible light. Since there are no more gaps in these isolation structures, the cross-talk performance is improved. Also, the formation of a single type of isolation structure according to the present disclosure simplifies fabrication processes compared to traditional methods (where two types of isolation structures are formed). This reduces fabrication time and cost. In addition, the continuous nature of the isolation structures herein obviates any misalignment issues that may be present in conventional image sensor devices (i.e., alignment between the metal grids and the trench isolations). Furthermore, the buried color filters are formed to be self-aligned with, and have a shorter optical path to, the target pixels therebelow. This also improves the performance of the image sensor of the present disclosure with respect to cross-talk and light-sensing capabilities. The processes discussed herein are also compatible with existing CMOS process flows.

One embodiment of the present disclosure pertains to a semiconductor image sensor. The image sensor includes a substrate having a first side and a second side that is opposite the first side. An interconnect structure is disposed over the first side of the substrate. A plurality of radiation-sensing regions is located in the substrate. The radiation-sensing regions are configured to sense radiation that enters the substrate from the second side. A plurality of isolation structures are each disposed between two respective radiation-sensing regions. The isolation structures protrude out of the second side of the substrate.

Another embodiment of the present disclosure pertains to a semiconductor image sensor. The image sensor includes a substrate having a front side and a back side opposite the front side. An interconnect structure is disposed over the front side of the substrate. A plurality of pixels is disposed in the substrate. The pixels are configured to detect light that enters the substrate through the back side. A dielectric layer is disposed over the back side of the substrate. The image sensor also includes a plurality of light-reflective components. The light-reflective components each have a first segment and a second segment. The first segment extends through the dielectric layer and extending at least partially into the substrate. The second segment protrudes out of the dielectric layer from the back side. The pixels are each disposed between two respective light-reflective components.

Yet another embodiment of the present disclosure pertains to a method of fabricating a semiconductor image sensor. A substrate is provided. The substrate contains a plurality of radiation-sensing regions formed therein. The substrate has a first side and a second side. The first side of the substrate is bonded to a carrier substrate. The substrate is thinned from the second side after the bonding. A dielectric layer is formed over the second side of the substrate after the thinning. A plurality of trenches is formed from the second side. The trenches extend through the dielectric layer and at least partially through the substrate. A plurality of isolation structures is formed in the trenches. Thereafter, at least a portion of the dielectric layer is removed such that portions of the isolation structures protrude out of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor image sensor device, comprising:
    forming a plurality of layers over a substrate that includes a plurality of radiation-sensing elements;
    etching a plurality of trenches that vertically extend through the plurality of layers and at least partially into the substrate, wherein the trenches interleave horizontally with the radiation-sensing elements;
    forming an isolation structure in each of the trenches, wherein the isolation structure includes a light-reflective material;
    partially etching a topmost layer of the plurality of layers between the isolation structures to expose segments of the isolation structures, wherein the exposed segments of the isolation structures and a remaining portion of the plurality of layers define a plurality of recesses; and
    forming color filters in the recesses.

2. The method of claim 1, further comprising: forming a passivation layer between the exposed segments of the isolation structures and the color filters.

3. The method of claim 1, wherein the plurality of layers include a first layer and a second layer formed over the first layer, the second layer being the topmost layer, and wherein the partially etching the topmost layer comprises partially removing the second layer without removing the first layer.

4. The method of claim 1, wherein the forming the isolation structure includes performing a planarization process to the isolation structure until upper surfaces of the isolation structure are co-planar with upper surfaces of the topmost layer of the plurality of layers.

5. A method of fabricating a semiconductor image sensor device, comprising:

providing a substrate that contains a plurality of radiation-sensing regions formed therein, the substrate having a first side and a second side;

bonding the first side of the substrate to a carrier substrate;

thinning the substrate from the second side after the bonding;

forming a dielectric layer over the second side of the substrate after the thinning;

forming a plurality of trenches from the second side, the trenches extending through the dielectric layer and at least partially through the substrate;

forming a plurality of isolation structures in the trenches, including filling the trenches with a material that reflects radiation and performing a polishing process to the material until portions of the material filling the trenches are co-planar with the dielectric layer; and thereafter removing at least a portion of the dielectric layer such that portions of the isolation structures protrude out of the dielectric layer.

6. The method of claim 5, wherein the filling of the trenches comprises depositing tungsten as the material to fill the trenches.

7. The method of claim 5, further comprising coating a passivation layer around the portions of the isolation structures that protrude out of the dielectric layer.

8. The method of claim 5, wherein after the removing, the portions of the isolation structures protruding out of the dielectric and a remaining portion of the dielectric layer collectively define a plurality of openings, and further comprising: forming a plurality of color filters in the plurality of openings, respectively.

9. The method of claim 5, further comprising: before the bonding, forming an interconnect structure over the first side of the substrate, wherein the bonding is performed such that the interconnect structure is bonded between the substrate and the carrier substrate.

10. The method of claim 5, further comprising, before the forming of the dielectric layer:
forming an antireflective coating (ARC) layer over the second side of the substrate; and
forming a buffer layer over the ARC layer;
wherein the dielectric layer is formed over the buffer layer, and wherein the trenches are formed so that they extend through the ARC layer and the buffer layer.

11. A method of fabricating a semiconductor image sensor device, comprising:
forming a plurality of layers over a substrate that includes a plurality of radiation-sensing elements;
forming a trench that extend through the plurality of layers and at least partially into the substrate, wherein the trench is located between a pair of adjacent radiation-sensing elements;
filling the trench with a radiation-reflective material; and
performing an etching process to partially remove a topmost layer of the plurality of layers so that a segment of the radiation-reflective material filling the trench is exposed.

12. The method of claim 11, further comprising: coating a barrier layer on surfaces of the trench before the filling the trench with the radiation-reflective material.

13. The method of claim 11, further comprising: removing portions of the radiation-reflective material outside the trench via a planarization process.

14. The method of claim 11, wherein the filling the trench comprises filling the trench with a metal material as the radiation-reflective material.

15. The method of claim 14, wherein the filling the trench comprises filling the trench with tungsten as the metal material.

16. The method of claim 11, comprising: forming a passivation layer on surfaces of the exposed segment of the radiation-reflective material.

17. The method of claim 16, further comprising: forming a color filter on a first portion of the passivation layer, wherein the color filter and the segment of the radiation-reflective material are horizontally separated by a second portion of the passivation layer.

18. The method of claim 11, wherein forming of the one or more layers includes forming a dielectric layer over the substrate.

19. The method of claim 18, the forming of the plurality of layers further comprises forming an anti-reflective coating layer and a buffer layer between the substrate and the dielectric layer.

20. The method of claim 19, wherein the etching process partially removes the dielectric layer without removing the anti-reflective coating layer and the buffer layer.

* * * * *